(12) United States Patent
Bianchi

(10) Patent No.: US 7,996,202 B2
(45) Date of Patent: *Aug. 9, 2011

(54) METHOD OF MODELING AND PRODUCING AN INTEGRATED CIRCUIT INCLUDING AT LEAST ONE TRANSISTOR AND CORRESPONDING INTEGRATED CIRCUIT

(75) Inventor: Raul Andres Bianchi, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

This patent is subject to a terminal disclaimer.

(21) Appl. No.: 12/264,506

(22) Filed: Nov. 4, 2008

(65) Prior Publication Data

US 2009/0055152 A1 Feb. 26, 2009

Related U.S. Application Data

(63) Continuation of application No. 10/339,640, filed on Jan. 9, 2003, now Pat. No. 7,480,604.

(30) Foreign Application Priority Data

Jan. 9, 2002 (FR) ...................................... 02 00217

(51) Int. Cl.
G06F 9/455 (2006.01)
(52) U.S. Cl. ........................................................ 703/14
(58) Field of Classification Search .................... 703/14, 703/4, 13, 15; 257/355, 502, 66, 412, 418, 257/372, 48, 410, 392, 607; 438/303, 217, 438/270, 199; 326/113; 716/20
See application file for complete search history.

(56) References Cited

U.S. PATENT DOCUMENTS

| | | | | |
|---|---|---|---|---|
| 5,578,508 A | * | 11/1996 | Baba et al. | 438/270 |
| 5,687,355 A | * | 11/1997 | Joardar et al. | 716/20 |
| 5,841,175 A | * | 11/1998 | Sugiura et al. | 257/392 |
| 6,246,973 B1 | * | 6/2001 | Sekine | 703/4 |
| 6,265,258 B1 | * | 7/2001 | Liang et al. | 438/217 |
| 6,576,966 B1 | * | 6/2003 | Bulucea | 257/408 |

(Continued)

FOREIGN PATENT DOCUMENTS

JP 2000-058817 2/2000

OTHER PUBLICATIONS

Stinebaugh, et al., "Correlation of $G_m$ Degradation of Submicrometer MOSFET's with Refractive Index and Mechanical Stress of Encapsulation Materials," IEEE Transactions on Electron Devices, Mar. 1989, pp. 542-547, 36:3.

(Continued)

*Primary Examiner* — Kandasamy Thangavelu
(74) *Attorney, Agent, or Firm* — Lisa K. Jorgenson; Stephen Bongini; Fleit Gibbons Gutman Bongini & Bianco P.L.

(57) ABSTRACT

A system is provided for modeling an integrated circuit including at least one insulated-gate field-effect transistor. The system includes generator means for defining a parameter representing mechanical stresses applied to the active area of the transistor, and processing means for determining at least one of the electrical parameters of the transistor based at least partially on the stress parameter. Also provided is a method of modeling an integrated circuit including at least one insulated-gate field-effect transistor, and a method of producing an integrated circuit including at least one insulated-gate field-effect transistor.

22 Claims, 10 Drawing Sheets

U.S. PATENT DOCUMENTS

| | | | | |
|---|---|---|---|---|
| 6,593,197 | B2* | 7/2003 | Wieczorek et al. | 438/303 |
| 6,621,146 | B1 | 9/2003 | Bowman | |
| 6,744,104 | B1* | 6/2004 | Aoki et al. | 257/372 |
| 6,798,028 | B2* | 9/2004 | Horstmann et al. | 257/412 |
| 6,838,698 | B1* | 1/2005 | Yamazaki et al. | 257/66 |
| 2002/0000834 | A1* | 1/2002 | Ooishi | 326/113 |
| 2002/0024045 | A1* | 2/2002 | Hayashida et al. | 257/48 |
| 2002/0041003 | A1* | 4/2002 | Udrea et al. | 257/502 |
| 2002/0063290 | A1* | 5/2002 | Ishii et al. | 257/355 |
| 2002/0066933 | A1* | 6/2002 | Tsu-Jae | 257/410 |
| 2002/0086473 | A1* | 7/2002 | Tsai et al. | 438/199 |

OTHER PUBLICATIONS

Momose, et al., "Relationship Between Mobility and Residual-Mechanical-Stress as Measured by Raman Spectroscopy for Nitrided-Oxide-Gate MOSFETS," IEEE CH2865, 1990, pp. 4.1.1-4.1.4.

Hamada, et al., "A New Aspect on Mechanical Stress Effects in Scaled MOS Devices," IEEE CH2874, 1990, pp. 113-114.

Hamada, et al., "Hot-Electron Trapping Activation energy in PMOSFET's Under Mechanical Stress," IEEE Electron Device Letters, Jan. 1994, pp. 31-32, 15:1.

Degraeve, et al., "Analysis of Externally Imposed Mechanical Stress Effects on the Hot-Carrier-Induced Degradation of MOSFET's," IEEE CH3332, 1994, pp. 29-33.

Ferreira, et al., "Mechanical Stress Analysis of an LDD MOSFET Structure," IEEE Transactions on Electron Devices, Sep. 1996, pp. 1525-1532, 43:9.

Degraeve, et al., "The Effect of Externally Imposed Mechanical Stress on the Hot-Carrier-Induced Degradation of Deep-Sub Micro nMOSFET's," IEEE Transactions on Electron Devices, Jun. 1997, pp. 943-950, 44:6.

Ali, H., "Stress-Induced Prametric Shift in Plastic Packaged Devices," IEEE Transactions on Components, Packaging, and Manufacturing Technology—Part B, Nov. 1997, pp. 458-462, 20:4.

Foty, D., "MOSFET Modeling for Circuit Simulation," IEEE Circuits & Devices, Jul. 1998, pp. 26-31, XP002212475, ISSN: 8755-3996, 14:4.

Chen, et al., "Enchanced Hot-Carrier Induced Degradation in Shallow Trench Isolated Narrow Channel PMOSFET's," IEEE Electron Device Letters, Sep. 1998, pp. 332-334, 19:9.

Foty, D., "Effective MOSFET Modeling for SPICE Circuit Simulation," NORTHCON/98 Conference Proceedings, Seattle, WA., Oct. 21-23, 1998, IEEE, New York, NY, pp. 228-235, XP010313455, ISBN: 0-7803-5075-8.

Arora, N.D., "Modeling and Characterization of Ultra Deep Submicron CMOS Devices," IEICE Transactions on Electronics, Institute of Electronics Information and Comm. Eng., Tokyo, Japan, Jun. 1999, pp. 967-975, E82-C:6, XP000919960, ISSN: 0916-8524.

Ishimaru, et al., "Channel Width Dependence of Hot-Carrier Induced Degradation in Shallow Trench Isolated PMOSFET's," IEEE Transactions on Electron Devices, Jul. 1999, pp. 1532-1536, 46:7.

Hook, et al., "The Dependence of Channel Length on Channel Width in Narrow-Channel CMOS Devices for 0.35-0.13 µm Technologies," IEEE Electron Device Letters, Feb. 2000, pp. 85-87, 21:2.

Yue, et al., "Hot-Carrier Degradation Mechanism in Narrow- and Wide-Channel n-MOSFET's with Recessed LOCOS Isolation Structure," IEEE Electron Device letters, Mar. 2000, pp. 130-132, 21:3.

Ito, et al., "Mechanical Stress Effect of Etch-Stop Nitride and its Impact on Deep Submicron Transistor Design," IEEE 7803, 2000, pp. 10.7.1-10.7.4.

Chung, et al., "A New Physical and Quantitative Width Dependent Hot Carrier Model for Shallow-Trench-Isolated CMOS Devices," IEEE 01CH37167 39th Annual International Reliability Physics Symposium, Orlando, Florida 2001, pp. 419-424.

Shimizu, et al., "Local Mechanical-Stress Control (LMC): A New Technique for CMOS-Performance Enhancement," IEEE 2001, pp. 19.4.1-19.4.4.

Bradley, et al., "Piezoresistive Characteristics of Short-Channel MOSFETs on (100) Silicon," IEEE Transactions on Electron Devices, Sep. 2001, pp. 2009-2015.

Lochtefeld, A., "Investigating the Relationship Between Electron Mobility and Velocity in Deeply Scaled NMOS via Mechanical Stress," IEEE Electron Device Letters, Dec. 2001, pp. 591-593, 22:12.

Preliminary Search Report dated Sep. 5, 2002 for Frech Patent No. 0200217.

* cited by examiner

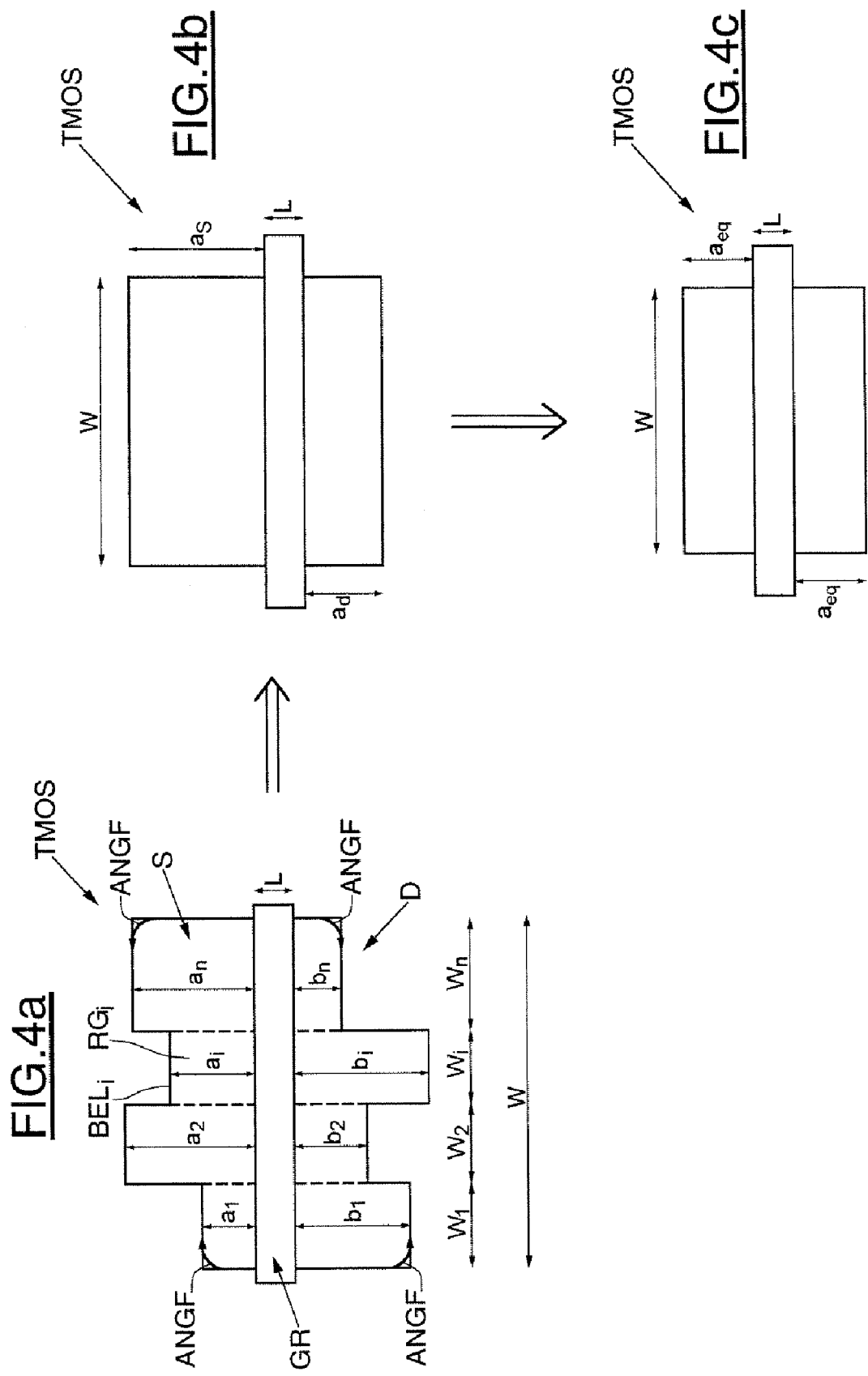

METHOD OF MODELING AND PRODUCING AN INTEGRATED CIRCUIT INCLUDING AT LEAST ONE TRANSISTOR AND CORRESPONDING INTEGRATED CIRCUIT

CROSS-REFERENCE TO RELATED APPLICATIONS

This application is a continuation of prior U.S. application Ser. No. 10/339,640, filed Jan. 9, 2003, now U.S. Pat. No. 7,480,604. The entire disclosure of U.S. application Ser. No. 10/339,640 is herein incorporated by reference.

Additionally, this application is based upon and claims priority from prior French Patent Application No. 02-00217, filed Jan. 9, 2002, the entire disclosure of which is herein incorporated by reference.

BACKGROUND OF THE INVENTION

1. Field of the Invention

The present invention relates to integrated circuits, and in particular to modeling integrated circuits such as insulated-gate field-effect transistors (MOSFETs).

2. Description of Related Art

Many MOSFET simulation models are currently available, for example the BSIM3v3.2 model available from the Department of Electrical Engineering and Computer Sciences, University of California, Berkeley and described in particular in the 1997-1998 user manual by Weidong Liu and others, which is herein incorporated by reference.

This kind of model is used by integrated circuit designers to define and simulate MOSFET in terms of their required electrical characteristics, for example carrier mobility, threshold voltage, drain current, etc.

In some cases it is found that the performance simulated using these simulation models does not match the real performance expected of the MOSFET finally produced.

The present invention aims to provide a solution to this problem.

SUMMARY OF THE INVENTION

It is an object of the present invention to provide a better approach to the modeling of transistors so that the real performance of the transistor finally produced is closer to the performance simulated using the simulation model.

Another object of the present invention is to produce integrated circuits including MOSFET whose electrical performance, in particular in terms of mobility, can be adjusted and improved as a function of the intended applications.

One embodiment of the present invention provides a system for modeling an integrated circuit including at least one insulated-gate field-effect transistor. The system includes generator means and processing means. The generator means defines a parameter representing mechanical stresses applied to an active area of the transistor, and the processing means determines at least one of the electrical parameters (P) of the transistor at least partially based on the stress parameter. In a preferred embodiment, the generator means defines a useful active area as some or the whole of the active area, and the stress parameter is a geometrical parameter $a_{eq}$ representing a distance in the direction of the length of the channel of the transistor between the gate of the transistor and the edge of the useful active area. Another embodiment of the present invention provides a method of modeling an integrated circuit including at least one insulated-gate field-effect transistor. According to the method, a parameter ($a_{eq}$) representing mechanical stresses applied to an active area of the transistor is defined, and the parameter ($a_{eq}$) is taken into account when determining at least one electrical parameter (P) of the transistor. In one preferred method, a useful active area (ZAU) is defined as some or the whole of the active area (ZA), and the stress parameter is a geometrical parameter $a_{eq}$ representing a distance in the direction of the length of the channel of the transistor between the gate of the transistor and the edge of the useful active area.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

BRIEF DESCRIPTION OF THE DRAWINGS

FIGS. 4a to 4c show the derivation of a geometrical parameter representing stresses applied to the active area of a first type of MOS transistor;

DETAILED DESCRIPTION OF PREFERRED EMBODIMENTS

Figure 1:
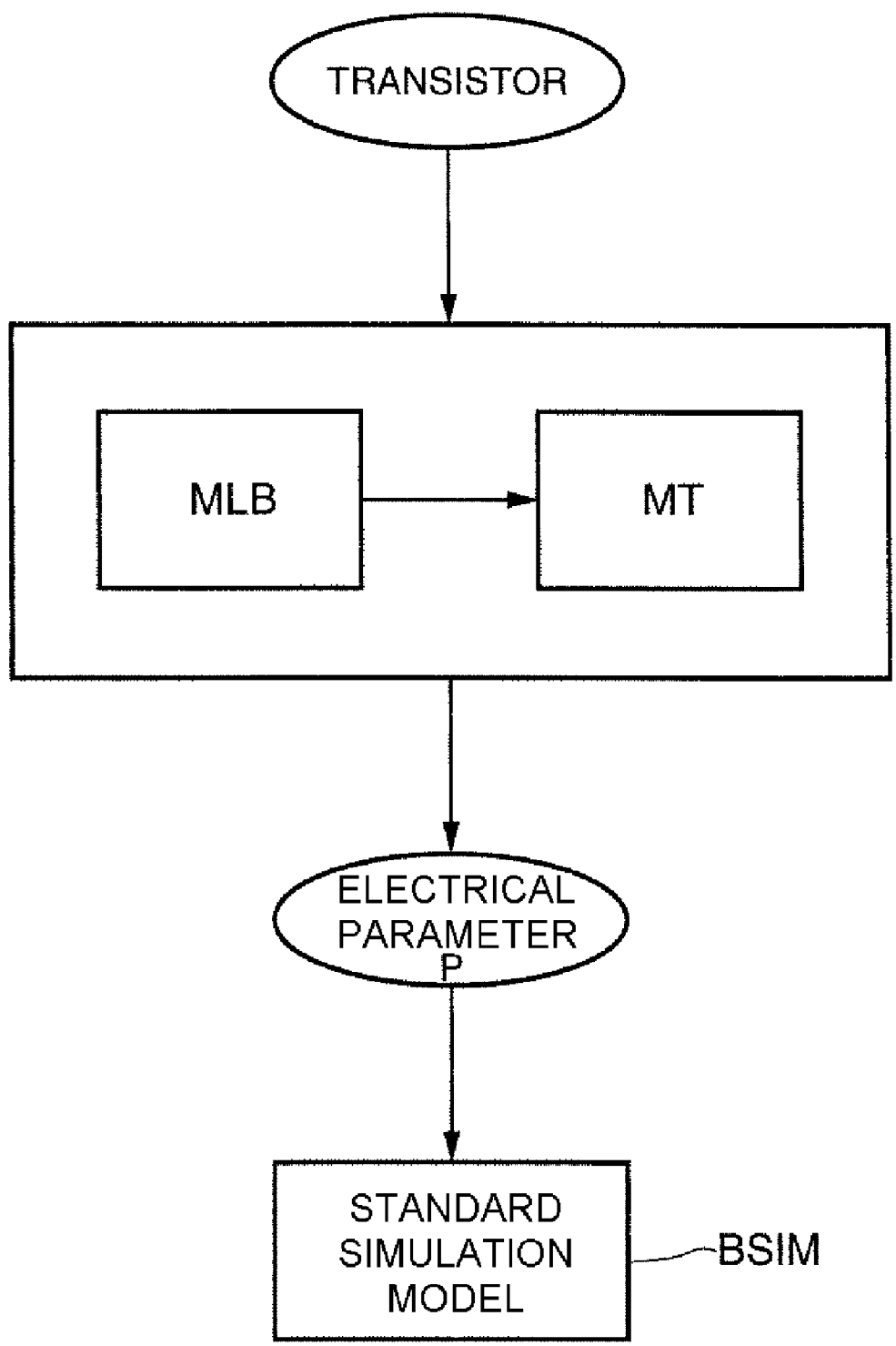
FIG. 1 shows generally a modeling system according to a preferred embodiment of the present invention.

Preferred embodiments of the present invention will be described in detail hereinbelow with reference to the attached drawings.

The present invention stems from the observation that some electrical parameters of a transistor, for example the mobility, threshold voltage or drain/source resistance, vary as a function of mechanical stresses applied to the channel of the transistor. The mechanical stresses are a result of the fabrication process, in particular the forming of electrically insulative regions delimiting the active area of the transistor, for example shallow trench isolation (STI) regions.

Preferred embodiments of the present invention therefore provide a method of modeling an integrated circuit including at least one insulated-gate field-effect transistor. According to the method, a parameter representing mechanical stresses applied to an active area of the transistor is defined and is taken into account when determining at least some electrical parameters of the transistor, for example the carrier mobility, threshold voltage, drain/source access resistance, etc.

In some simple situations, the method could model some electrical parameters directly, taking account of the stress parameter. However, as a general rule, preferred embodiments of the present invention advantageously complement existing standard or non-standard simulation models, for example by correcting some input parameters of existing models that are used in the existing models to determine more sophisticated electrical parameters of the transistors.

For example, the low-field mobility $\mu 0$ of the carriers at room temperature is one parameter that the method of the present invention can correct directly to allow for mechanical stresses. Once it has been corrected, this parameter $\mu 0$ is injected into an existing model, for example the BSIM3v3.2 model previously cited, where it is used to determine the effective carrier mobility $\mu_{\mathit{eff}}$, which is a more sophisticated parameter taking account in particular of secondary effects in the electrical behavior of the transistor.

In this way, in the final analysis, the electrical parameter $\mu_{\mathit{eff}}$ is determined allowing for the effect of mechanical stresses on the active area of the transistor.

Similarly, the stray drain/source resistance per unit width of the channel Rdsw is a parameter that can easily be determined using the method according to the present invention allowing for the mechanical stresses, and which is subsequently injected into an existing model to determine the drain/source resistance Rds.

The same can also apply to the following parameters, for example:

Vth0: threshold voltage at zero gate/source voltage and for a large channel width,
K1: first order body effect coefficient,
K2: second order body effect coefficient,
K3: narrow channel width coefficient,
K3b: K3 substrate effect coefficient,
Dvt0: first coefficient of short channel effect on threshold voltage,
Dvt0W: first coefficient of short channel effect on threshold voltage for a short channel length,
Eta0: drain-induced barrier lowering (DIBL) coefficient in the subthreshold region, and
Etab: body bias coefficient for the DIBL effect in the subthreshold region.

Once determined by the method according to the present invention allowing for mechanical stresses, such parameters are injected into the BSIM3v3.2 model to determine the threshold voltage Vth.

In one embodiment of the present invention, a "useful" active area is defined as a portion or the whole of the active area of the transistor. This useful active area can be the portion of the active area contained within a rectangle whose lateral dimension in the direction of the width of the channel is equal to the width of the channel, and each edge of which extending in the direction of the width of the channel is at a predetermined limit distance from the corresponding flank of the gate, which distance can be of the order of ten times a minimum distance required for a contact terminal in the active area. This is explained in detail later.

The stress parameter is then preferably a geometrical parameter $a_{eq}$ representing a distance in the direction of the length of the channel of the transistor between the gate of the transistor and the edge of the useful active area.

Thus, the present invention is noteworthy in that an extremely simple and unidimensional geometrical parameter, in this instance a distance, allows for the effect on the electrical parameters of the transistor of three-dimensional mechanical stresses.

If the useful active area of the transistor is rectangular and the gate is centered in the useful active area, to define geometrically identical source and drain regions, the stress parameter $a_{eq}$ can then be the distance in the direction of the length of the channel between one flank of the gate and the corresponding edge of the source or drain region.

However, transistors do not always have rectangular active areas and gates centered in the active areas. Also, if the useful active region of the transistor includes geometrically different source and drain regions, a first geometrical parameter $a_s$ representing a first distance in the direction of the length of the channel between the gate and the edge of the source region is advantageously defined.

A second geometrical parameter $a_d$ representing a distance in the direction of the length of the channel between the gate and the edge of the drain region is also defined.

The stress parameter $a_{eq}$ is then defined by a relationship between the first and second geometrical parameters.

For example, the stress parameter $a_{eq}$ can be made equal to $1/(\frac{1}{2}a_s + \frac{1}{2}a_d)$.

If the useful active area of the transistor includes at least one source or drain region each lateral side of which is free of obtuse angles, and if it is possible to divide the source and drain region into n individual rectangular regions, n being greater than or equal to 1, each individual region is defined by an individual width $W_i$ and by an individual distance $a_i$ in the direction of the length of the channel between the gate and an individual edge of the individual region.

The corresponding geometrical parameter $a_s$ or $a_d$ can then be equal to $$W \bigg/ \left( \sum_{i=1}^{n} W_i / a_i \right),$$

where W is the width of the channel of the transistor.

On the other hand, if the useful active area of the transistor includes at least one source or drain region at least one lateral side of which has at least one obtuse angle, then the corresponding parameter $a_s$ or $a_d$ can be considered to be equal to infinity.

Similarly, for reasons of simplification, if an individual distance $a_i$ of an individual region of the useful active area is equal to the limit distance delimiting the rectangle of the useful active area, then the individual distance $a_i$ is considered to be equal to infinity, for example.

In one embodiment of the present invention, an electrical parameter P of the transistor is determined from an equation involving: the value of the electrical parameter determined for a required minimum distance of the active area, the value of the stress parameter of the transistor, the value of the required minimum distance, and a coefficient associated with the electrical parameter and depending on the width and the length of the channel of the transistor.

If the stress parameter is a geometrical parameter $a_{eq}$, the electrical parameter P concerned is then defined by the following equation, for example:

$$P = Pa_{min}(1 + CP_{L,W}(1 - a_{min}/a_{eq})),$$

in which $Pa_{min}$ is the value of the electrical parameter P determined for the required minimum distance $a_{min}$ of the active area and $CP_{L,W}$ is the coefficient associated with the parameter P.

In this case, determining the coefficient $CP_{L,W}$ includes the following steps, for example:

reference transistors are produced having different reference values Wref, Lref for the width and the length of the channel and different values for the stress parameter, the value of the electrical parameter P concerned for each reference transducer produced is measured, a reference coefficient $CP_{Lref,Wref}$ is determined for each pair of values Wref, Lref, being the slope of a straight line whose equation is $Y=1+CP_{Lref,Wref}X$, in which $Y=P/Pa_{min}$ and $X=1-a_{min}/a_{eq}$, and the coefficient $CP_{L,W}$ is determined from the reference coefficients $CP_{Lref,Wref}$ allowing for the width W and the length L of the channel of the transistor, possibly using interpolation.

The present invention further provides a system for modeling an integrated circuit including at least one insulated-gate field-effect transistor.

According to one general feature of the present invention, the system preferably includes generator means adapted to define a parameter representing mechanical stresses applied to the active area of the transistor and processing means adapted to determine at least some of the electrical parameters of the transistor taking account of the stress parameter.

In one embodiment of the present invention, the generator means is adapted to define a useful active area as some or the whole of the active area and the stress parameter is a geometrical parameter $a_{eq}$ representing a distance in the direction of the length of the channel of the transistor between the gate of the transistor and the edge of the useful active area.

In one embodiment of the present invention, the useful active area of the transistor is rectangular and the gate is centered in the useful active area to define geometrically identical source and drain regions. The generator means defines the stress parameter $a_{eq}$ as the distance in the direction of the length of the channel between a flank of the gate and the corresponding edge of the source or drain region.

In another embodiment of the present invention, the useful active area of the transistor includes geometrically different source and drain regions. The generator means defines a first geometrical parameter $a_s$ representing a first distance in the direction of the length of the channel between the gate and the edge of the source region and a second geometrical parameter $a_d$ representing a distance in the direction of the length of the channel between the gate and the edge of the drain region. The generator means defines the stress parameter $a_{eq}$ by an equation linking the first geometrical parameter and the second geometrical parameter.

In one embodiment of the present invention, the processing means defines an electrical parameter of the transistor by an equation involving: the value of the electrical parameter determined for a reference distance, for example a required minimum distance of the active area, the value of the stress parameter of the transistor, the value of the reference distance, for example the required minimum distance, and a coefficient associated with the electrical parameter and depending on the width and the length of the channel of the transistor.

The electrical parameter P concerned can then be defined by the equation $P=Pa_{min}(1+CP_{L,W}(1-a_{min}/a_{eq}))$, in which $Pa_{min}$ is the value of the electrical parameter P determined for the required minimum distance $a_{min}$ of the active area and $CP_{L,W}$ is the coefficient associated with the parameter P.

The modeling device then includes a plurality of reference transistors having different reference values Wref, Lref for the channel width and length and different values for the stress parameter.

Further, the processing means advantageously includes:

measuring means for measuring the value of the electrical parameter P for each reference transistor produced, first calculator means for calculating for each pair of values Wref, Lref a reference coefficient $CP_{Lref,Wref}$ defined as the slope of the straight line of the equation $Y=1+CP_{Lref,Wref}X$, in which $Y=P/Pa_{min}$ and $X=1-a_{min}/a_{eq}$, and second calculator means for calculating the coefficient $CP_{L,W}$ from the reference coefficients $CP_{Lref,Wref}$ taking account of the width W and the length L of the channel of the transistor, possibly using interpolation.

For the production of transistors, the present invention preferably also adjusts the geometry of the active area of the transistor as a function of a required value of an electrical parameter, for example the carrier mobility, threshold voltage, etc.

In other words, it is possible to determine the electrical parameter concerned for a given geometrical parameter of the active area using a modeling method according to an embodiment of the present invention. Consequently, and conversely, to produce an integrated transistor, it is possible to determine the geometrical parameter of the active area of the transistor that will produce the required value for the electrical parameter concerned.

In other words, the present invention also provides a method of producing an integrated circuit including at least one insulated-gate field-effect transistor, in which the geometry of an active area of the transistor is defined using a parameter representing mechanical stresses applied to the active area, allowing for a required value of at least one electrical parameter of the transistor determined by a modeling method as defined hereinabove and allowing for the stress parameter.

Accordingly, the geometry of an active area of a transistor can be adjusted to optimize the transistor in terms of mobility, for example, which will have the further consequence of reducing the drain/source resistance, which is doubly beneficial in the case of a MOSFET.

In one embodiment, a useful active area is defined as some or the whole of the active area and the stress parameter is a geometrical parameter $a_{eq}$ representing a distance in the direction of the length of the channel of the transistor between the gate of the transistor and the edge of the useful active area.

Accordingly, if the transistor is an NMOS transistor and the geometrical parameter $a_{eq}$ is more than twice a minimum distance $a_{min}$ required for a contact terminal in the active area, an improvement in carrier mobility in particular is obtained, compared to a transistor in which the length of the active area is equal to the required minimum distance.

Similarly, if the integrated circuit includes at least one block including a plurality of NMOS transistors for more than 80% of which the geometrical parameter $a_{eq}$ is more than twice the minimum distance, the whole of the block of the integrated circuit is considered to have an advantage in terms of the mobility criterion in particular.

These advantages, in terms of mobility in particular, are also obtained if the transistor is a PMOS transistor. In this case, the geometrical parameter $a_{eq}$ is then preferably less than twice the required minimum distance.

Similarly, this advantage with regard to the mobility criterion in particular also applies to an integrated circuit including at least one block including a plurality of PMOS transistors of which more than 80% have their geometrical parameter $a_{eq}$ less than twice the required minimum distance, for example.

The present invention also provides an integrated circuit including at least one insulated-gate field-effect transistor.

According to one general feature of the present invention, the active area of the transistor includes a useful active area defined as a portion or the whole of the active area of the transistor and the distance $a_{eq}$ in the direction of the length of the channel of the transistor between the gate of the transistor and the edge of the useful active area is different from a required minimum distance $a_{min}$ for a contact terminal on the active area.

In one embodiment, the transistor is an NMOS transistor and the distance $a_{eq}$ is greater than twice the minimum distance $a_{min}$.

In another embodiment, the integrated circuit includes at least one block including a plurality of NMOS transistors and more than 80% of the NMOS transistors have their geometrical parameter $a_{eq}$ greater than twice the minimum distance $a_{min}$.

In another embodiment of the present invention, the transistor is a PMOS transistor and the distance $a_{eq}$ is less than twice the minimum distance $a_{min}$.

In one embodiment of the present invention, the integrated circuit includes at least one block including a plurality of PMOS transistors and more than 80% of the PMOS transistors have their distance $a_{eq}$ less than twice the minimum distance $a_{min}$.

In any of the above embodiments, the useful active area can be the portion of the active area within a rectangle whose lateral dimension in the direction of the width of the channel is equal to the width of the channel and each edge of which in the direction of the width of the channel is at a predetermined limit distance from the corresponding flank of the gate, for example of the order of ten times the required minimum distance $a_{min}$.

Exemplary embodiments of the present invention will now be described in detail with reference to the figures.

FIG. 1 shows generally a modeling system according to a preferred embodiment of the present invention. In FIG. 1, generator means MLB produces a stress parameter representing mechanical stresses applied to the active area of a transistor from the layout diagram of the transistor. In material terms, the generator means can consist of an extractor (known to the person skilled in the art) which extracts from transistor layout diagrams dimensional parameters of the transistor, for example the length and the width of the channel, as well as information on connections.

Once this stress parameter has been determined, as described in more detail later, processing means MT, preferably implemented as software in a microprocessor for example, determines at least some of the electrical parameters of the transistor P allowing for the stress parameter.

For example, the electrical parameter P can be the low-field carrier mobility µ0 at room temperature, the threshold voltage Vth0 at zero gate/source voltage and for a long channel, or the stray source/drain resistance Rdsw per unit width of the channel.

These electrical parameters P that take account of the stresses applied to the active area of the transistor can then be injected into a standard BSIM simulation model, such as the BSIM3v3.2 model from the University of California, Berkeley previously cited. The model can then be used to calculate other, more sophisticated parameters, such as the effective mobility $\mu_{\mathit{eff}}$, the drain/source resistance Rds, and the threshold voltage Vth. However, the parameters obtained from the BSIM model also allow for stresses applied to the active area of the transistor.

It has been observed that it is possible to take account of all three-dimensional stresses applied to the active area using a stress parameter that is in fact a one-dimensional parameter, to be more precise a geometrical parameter $a_{eq}$ representing a distance in the direction of the length of the channel of the transistor between the gate of the transistor and the edge of the active area.

Figure 2:
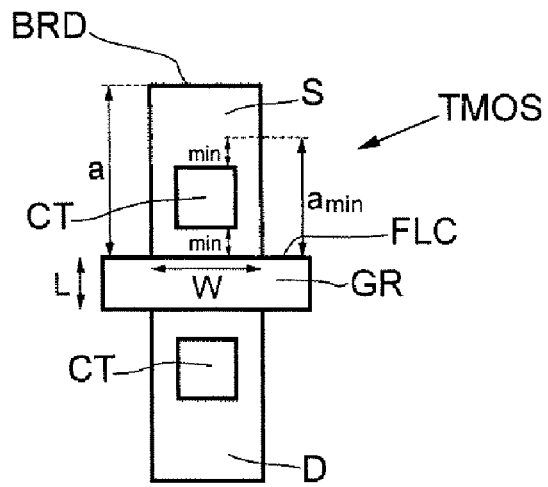
FIG. 2 is a diagram of a MOS transistor.

When, as shown in FIG. 2, the active area of a PMOS transistor is rectangular and the gate GR is centered in the active area to define geometrically identical source and drain regions S and D, the stress parameter $a_{eq}$ is defined as the distance a in the direction of the length L of the channel between a flank FLC of the gate and the corresponding edge BRD of the source or drain region, here the source region. Note that this distance a can be different from a minimum distance $a_{min}$ required for producing a contact terminal CT in the source or drain region.

Figure 3:
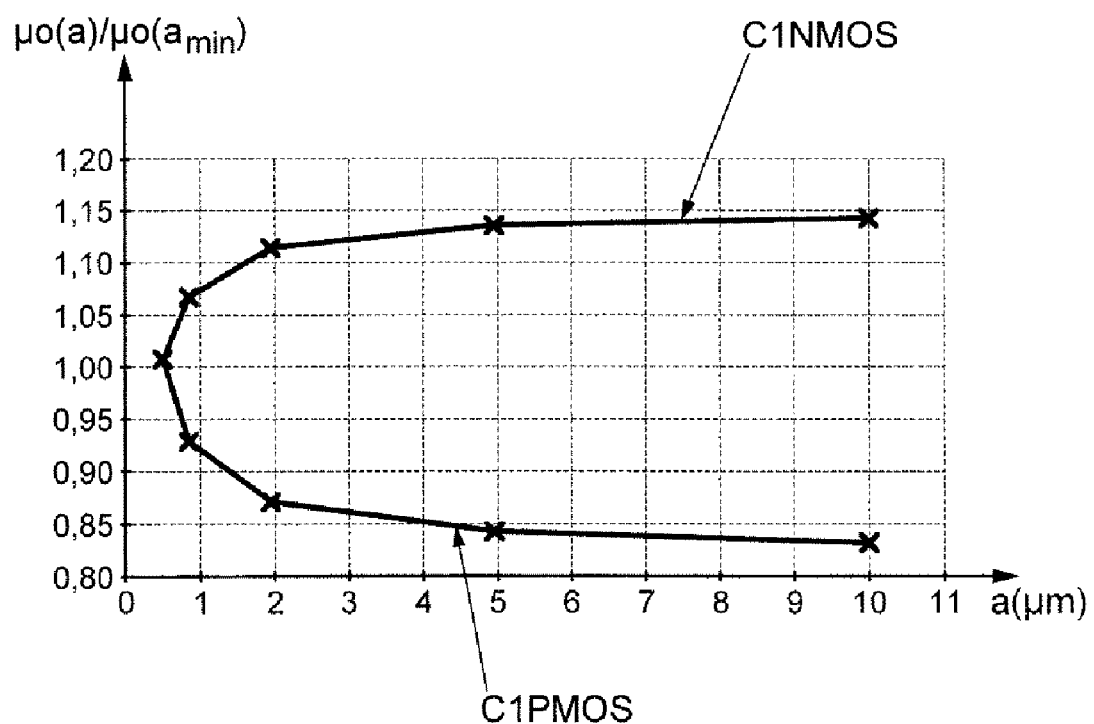
FIG. 3 shows two curves illustrating the advantages of a preferred embodiment of the present invention in terms of transistor carrier mobility.

FIG. 3 shows the variation of a function of the distance a of the ratio between the mobility µ0 for the value a and the mobility µ0 for the value $a_{min}$. Note that the mobility µ0 increases with a for an NMOS transistor (curve C1NMOS) and decreases with a for a PMOS transistor (curve C1PMOS). On the other hand, for a PMOS transistor, the mobility would increase if a were less than $a_{min}$.

If the active area of the transistor includes geometrically different source and drain regions, a first geometrical parameter $a_s$ is preferably defined representing a first distance in the direction of the length of the channel between the gate and the edge of the source region. A second geometrical parameter $a_d$ is preferably defined representing a distance in the direction of the length of the channel between the gate and the edge of the drain region. The stress parameter $a_{eq}$ is then defined by the following equation:

$$a_{eq}=1/(\tfrac{1}{2}a_s+\tfrac{1}{2}a_d) \qquad (I)$$

Figure 5B:
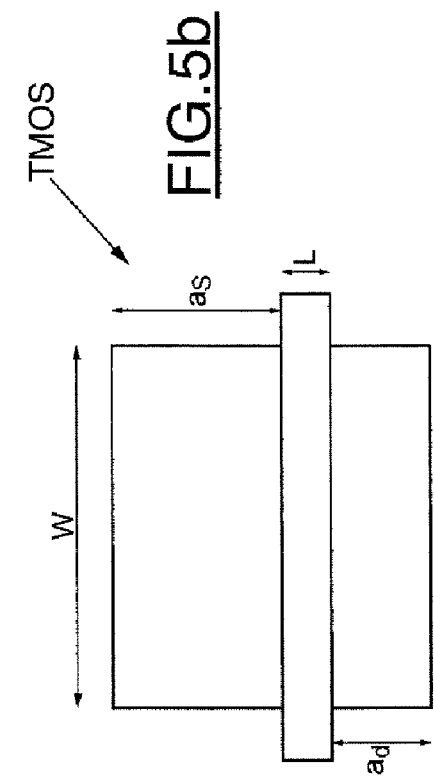
FIGS. 5a, 5b, 6 and 7 show the derivation of two other geometrical parameters representing stresses applied to the active areas of two other types of MOS transistor.
Figure 5A:
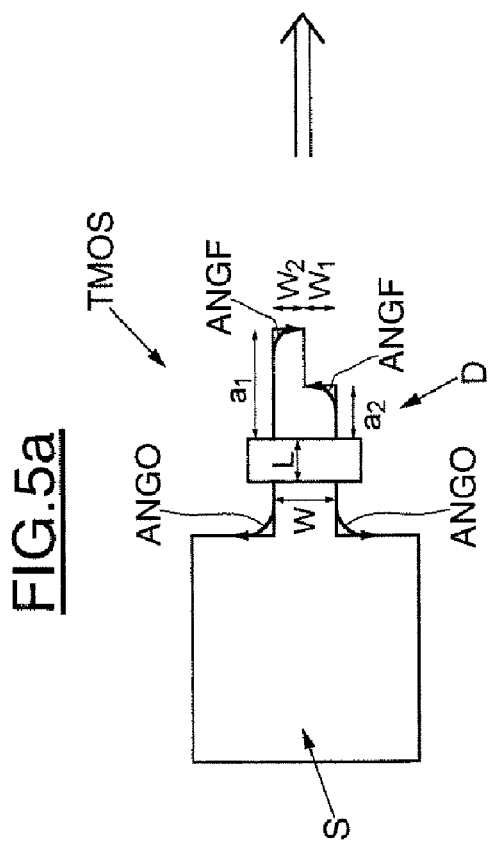
Figure 6:
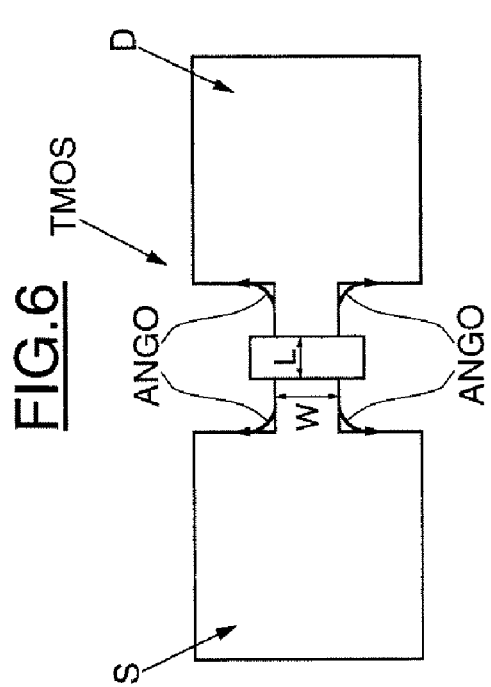

Not only can the source and drain regions be geometrically different, but they can also be irregular, as is the case in FIG. 4a or in FIGS. 5a and 6.

Geometrically irregular source and drain areas having acute angles ANGF, as shown in FIG. 4a and on the right-hand side of FIG. 5a, are distinguished from those having obtuse angles ANGO, as shown on the left-hand side of FIG. 5a and in FIG. 6.

Refer now to FIG. 4a in particular, which shows a source region S and a drain region D, each lateral side of which is free of obtuse angles and defines with the perpendicular edge of the area concerned an acute angle ANGF, here an angle equal to 90°.

The source region S is divided into n individual regions $RG_i$ (here n=4). Each individual region $RG_i$ has an individual width $W_i$ and an individual edge $BEL_i$ at an individual distance $a_i$ in the direction of the length L of the channel from the gate GR.

The geometrical parameter $a_s$ is then defined by the following equation:

$$a_s = W \bigg/ \left( \sum_{i=1}^{n} W_i/a_i \right) \qquad (II)$$

in which W is the total width of the channel.

Similarly, the drain region D is divided into four individual regions having the individual width $W_i$ and whose extreme edge is at an individual distance $b_i$ from the corresponding flank of the gate GR.

The geometrical parameter $a_d$ is then defined by the following equation:

$$a_d = W / \left( \sum_{i=1}^{n} W_i / b_i \right) \quad \text{(III)}$$

From the modeling point of view, the FIG. 4a TMOS transistor is then equivalent to the FIG. 4b TMOS transistor.

Further, the stress parameter $a_{eq}$ is then defined by equation (I) above. From the modeling point of view, the FIG. 4a TMOS transistor is then equivalent to the FIG. 4c TMOS transistor having a regular and rectangular active area with a centered gate GR.

It must be pointed out that, this time, the parameter $a_{eq}$ can be very much greater than the parameter $a_{min}$ or much less than the parameter $a_{min}$.

Irregular source or drain surfaces having obtuse angles ANGO are described next with reference to FIGS. 5a to 7.

As shown in FIG. 5a and FIG. 6, the presence of an obtuse angle ANGO (here an angle of 270°) at the level of a lateral edge of the area concerned implies a lateral extension of the region concerned toward the exterior of the channel.

For this kind of source or drain region, the corresponding geometrical parameter $a_s$ or $a_d$ is preferably then taken as equal to infinity.

The TMOS transistor that is geometrically equivalent from the modeling point of view to the FIG. 5a TMOS transistor is that shown in FIG. 5b with the parameter $a_s$ equal to infinity and the parameter $a_d$ defined by the above equation III.

Figure 7:
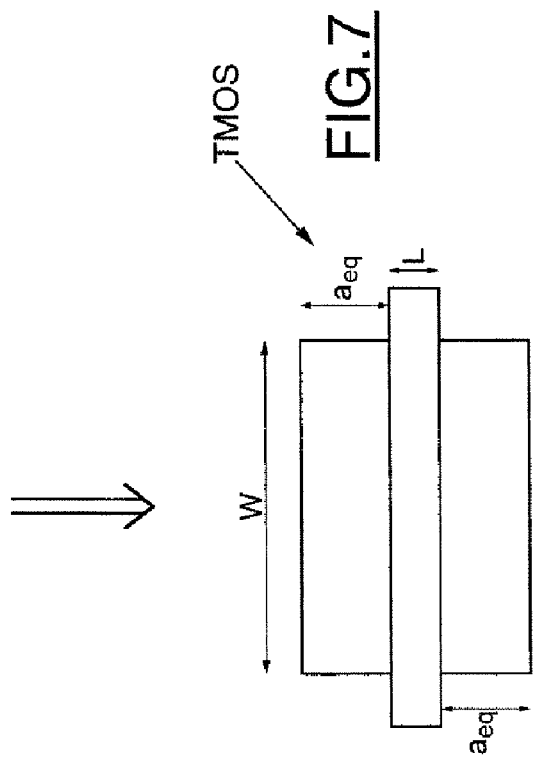

The TMOS transistor finally equivalent from the modeling point of view to the FIG. 5a transistor is the FIG. 7 TMOS transistor in which $a_{eq}$ is still defined by the above equation I but in this instance is equal to $2a_d$, since $a_s$ is equal to infinity.

In FIG. 6, the source and drain regions both have obtuse angles ANGO. Consequently, the two parameters $a_s$ and $a_d$ are equal to infinity and the parameter $a_{eq}$ of the equivalent TMOS transistor (FIG. 7) is, in theory, still defined by the above equation I and is in practice equal to infinity, since $a_s$ and $a_d$ are themselves equal to infinity.

Figure 8:
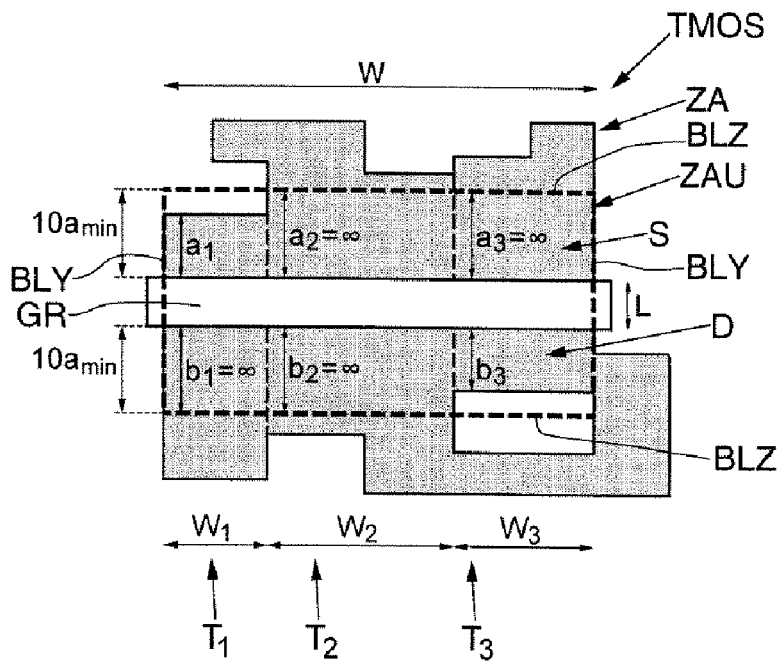
FIG. 8 shows the definition of a useful active area within an active area of an MOS transistor.

If the active area ZA of a TMOS transistor is particularly complex, as is the case in FIG. 8 for example, it is then preferable to define a "useful" active area ZAU inside the active area of the transistor, which is contained within a rectangle each of whose edges BLZ in the direction of the width W of the channel is at a predetermined limit distance from the corresponding flank of the gate, which distance is here equal to $10a_{min}$.

Additionally, the lateral dimension of this rectangle, still in the direction of the width of the channel, i.e. in fact in the direction of the length of the edges BLZ (the distance between the lateral edges BLY), is equal to the width W of the channel.

Here, the value $10a_{min}$ is a good compromise between the improvement in mobility that can be hoped for, for example, and the simplicity of the modeling. Beyond this value $10a_{min}$, the improvement in mobility is very slight, as shown in the curve C1NMOS in FIG. 3.

Having defined the useful active area ZAU, the procedure is then as previously described, possibly dividing the source and drain regions into n individual regions, here three individual regions defining three individual transistors $T_1$, $T_2$, $T_3$.

Furthermore, an individual distance $a_i$ or $b_i$ is then preferably considered equal to infinity if it is equal to the limit distance $10a_{min}$.

The parameters $a_s$ and $a_d$ of the TMOS transistor limited to the useful active area are then determined as previously described.

Thus, the parameter $a_s$ defined by the above equation II is in fact substantially defined by the following equation:

$$a_s = W/(W_1/a_1) \quad \text{(IV)}$$

since the distances $a_2$ and $a_3$ are equal to infinity.

Similarly, the parameter $a_d$ is then simply defined by the following equation:

$$a_d = W/(W_3/b_3) \quad \text{(V)}$$

since the distances $b_1$ and $b_2$ are equal to infinity.

The equivalent parameter $a_{eq}$ is still defined by the above equation I.

Once the geometrical parameter $a_{eq}$ has been obtained, the processing means determines the electrical parameter of the transistor P.

In this embodiment, the electrical parameter P is defined by the following equation:

$$P = Pa_{min}(1 + CP_{L,W}(1 - a_{min}/a_{eq})) \quad \text{(VI)}$$

in which $Pa_{min}$ is the value of the electrical parameter P determined for the required minimum distance $a_{min}$ of the active area and $CP_{L,W}$ is a coefficient associated with the electrical parameter P and depending on the width W and the length L of the channel of the transistor.

Figure 9:
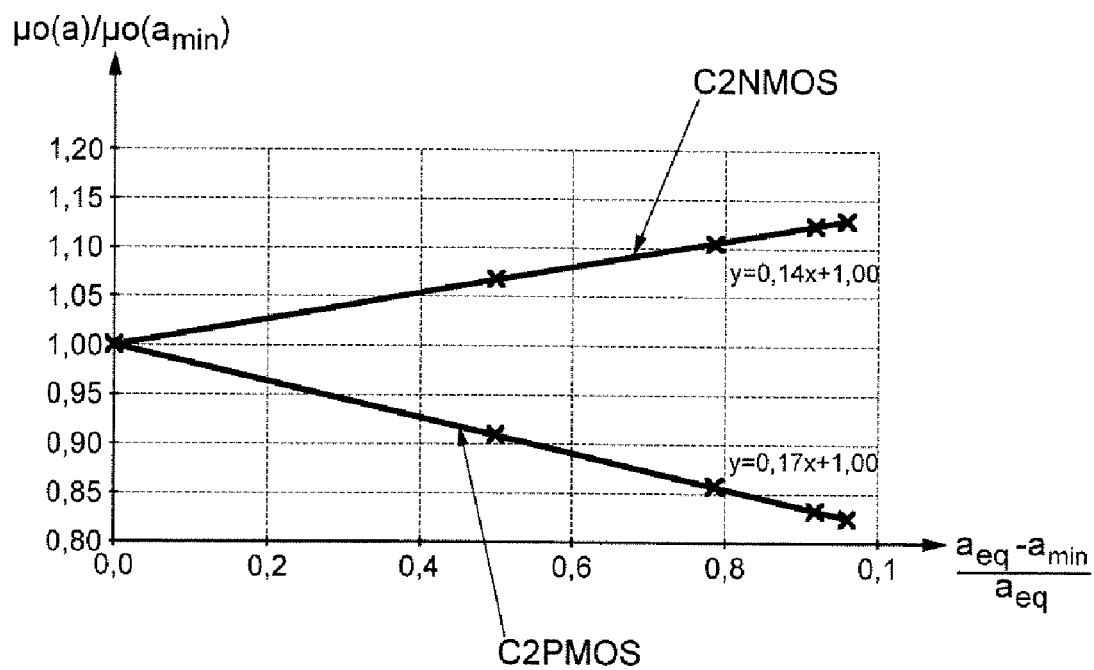
FIG. 9 shows two other curves illustrating a relationship between carrier mobility and the geometrical parameter representing stresses.

This equation is shown in the particular case of the mobility $\mu0$ in FIG. 9. The curve C2NMOS, which is in fact a straight line, illustrates this equation for an NMOS transistor, and the straight line C2PMOS illustrates this equation for a PMOS transistor. The coefficient $CP_{L,W}$ thus appears to be the slope of a straight line of this kind.

Figure 10:
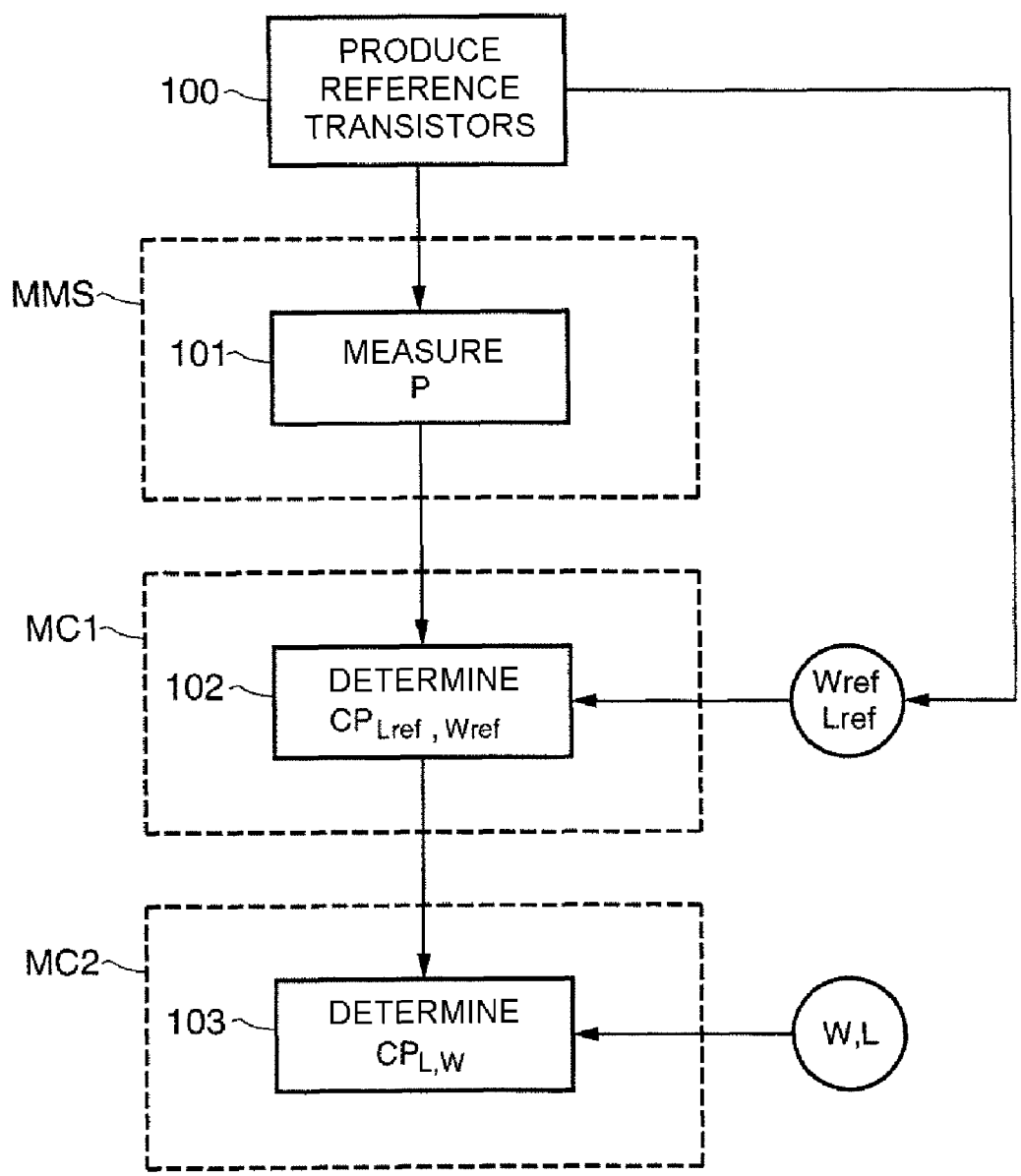
FIG. 10 shows in more detail how the modeling system determines the slope of the curves shown in FIG. 9.

The procedure shown in FIG. 10 is advantageously used to determine the coefficient $CP_{L,W}$ associated with the parameter P.

Several test or reference transistors are produced (step 100) with different reference values $W_{ref}$ and $L_{ref}$ for the width and the length of the channel and different values for the stress parameter $a_{eq}$.

Conventional measuring systems MMS are then used to measure the value of the electrical parameter P of concern for each reference transistor produced (step 101). For example, a mobility or a threshold voltage can be measured on a reference transistor using the known Hammer method.

First calculation means MC1 then determines (step 102), for each pair of values $W_{ref}$ and $L_{ref}$, a reference coefficient $CP_{Lref,Wref}$ which is the slope of the straight line for the equation:

$$Y = 1 + CP_{Lref,Wref} X$$

in which:

$$Y = P/Pa_{min}, \text{ and}$$

$$X = 1 - a_{min}/a_{eq}.$$

Second calculation means MC2 determines (step 103) the coefficient $CP_{L,W}$ from the reference coefficients $CP_{Lref,Wref}$, allowing for the width W and the length L of the channel of the transistor, possibly using interpolation.

Figure 11:
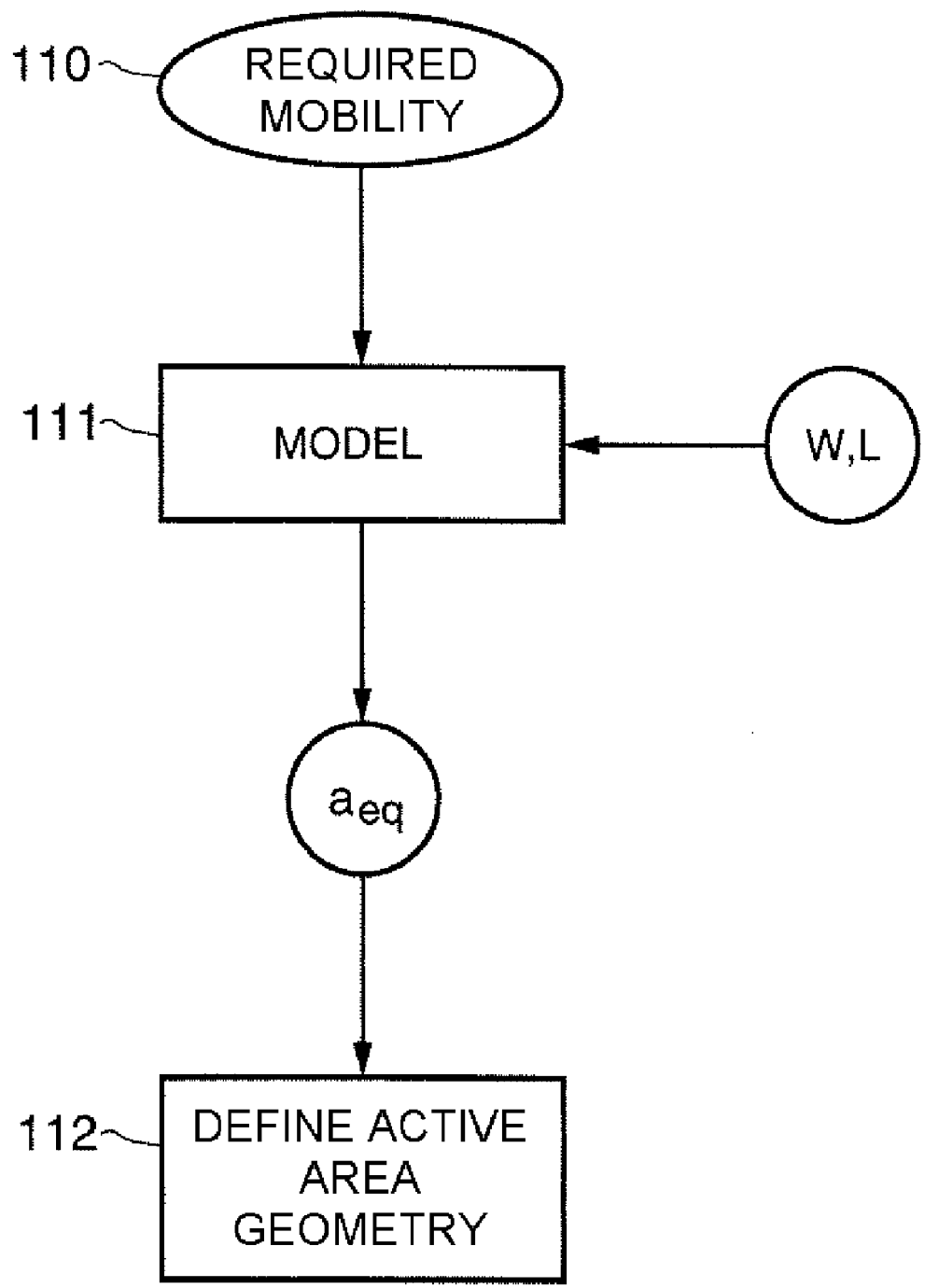
FIG. 11 shows a general flowchart of one exemplary application of a method in accordance with a preferred embodiment of the present invention.

The present invention can also be used to produce integrated circuits including MOS transistors in which the geometry of the active area of the transistors can be adjusted as a function of a required value of an electrical parameter of the transistor, for example the mobility (FIG. 11).

In this case, as shown in FIG. 11, for a required mobility (step 110) and for a chosen channel width and length for the transistor, application (step 111) of the simulation model according to the present invention described above delivers the value of the stress parameter $a_{eq}$. The geometry of the active area of the transistor can then be defined (step 112).

Figure 12:
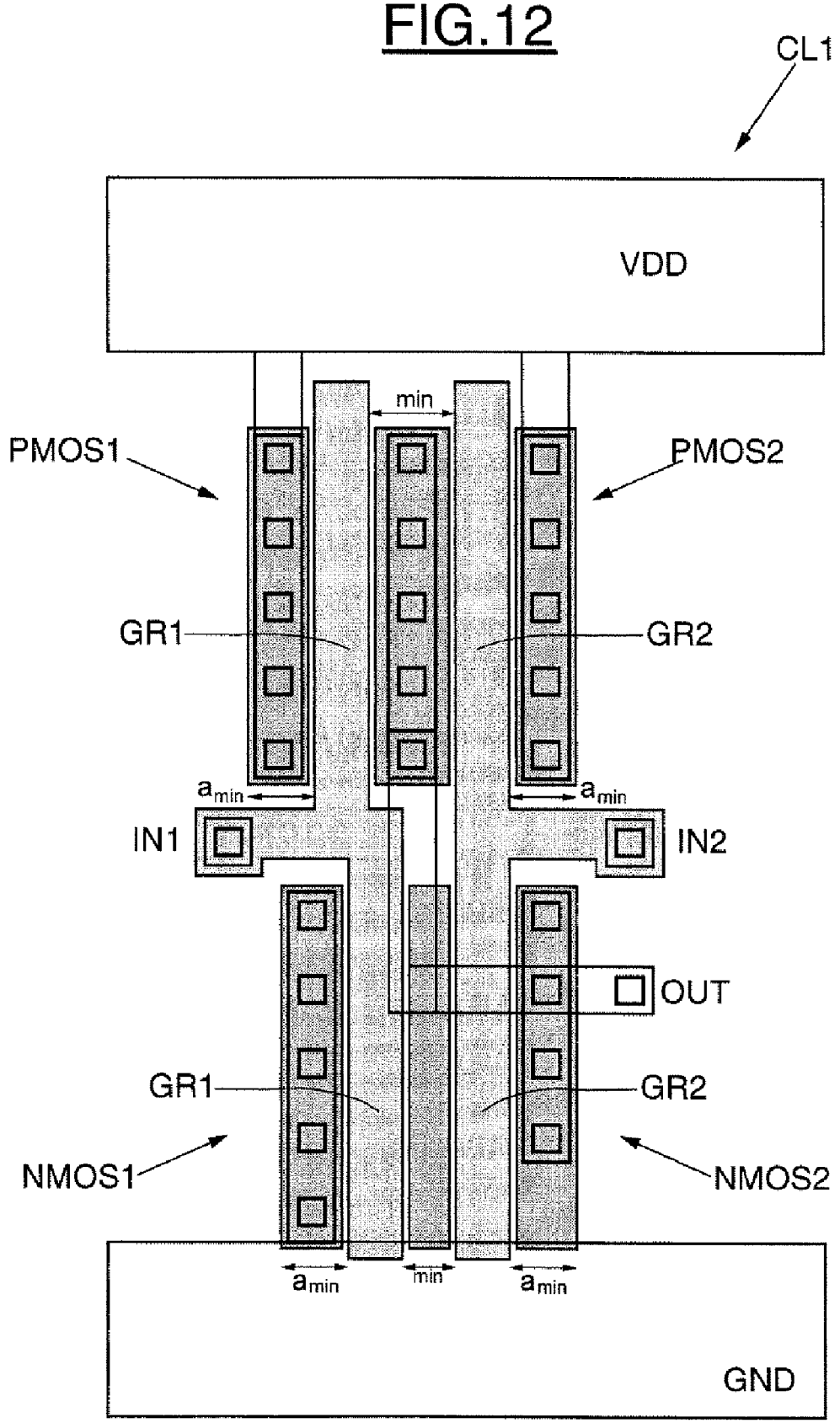
FIGS. 12 to 14 show three different geometrical configurations of a base cell of an integrated circuit, providing different mobilities.

Thus, FIG. 12 shows a diagram of the layout diagram of a basic NAND gate cell CL1 with two inputs (NAND2 gate). The cell conventionally includes two PMOS transistors PMOS1 and PMOS2 and two NMOS transistors NMOS1 and NMOS2. The first input IN1 of the cell CL1 is taken to the gates GR1 of the two transistors PMOS1 and NMOS1 and the second input IN2 of the cell is taken to the gates GR2 of the two transistors PMOS2 and NMOS2. The output OUT of the cell CL1 is taken from the common source region of the transistors PMOS1 and PMOS2.

FIG. 12 shows that the respective lengths in the direction of the length of the channel of the source and drain areas of the transistors are made equal to the minimum distance $a_{min}$. Likewise, the spacing between the gates is made equal to a minimum value min. Consequently, this kind of cell is produced applying a high density criterion.

With regard to the PMOS transistors, on the other hand, the stress parameter $a_{eq}$ is greater than the parameter $a_{min}$ and less than twice that parameter. The same applies to the NMOS transistors. Consequently, this kind of cell CL1 is not optimized in terms of mobility, in particular compared to a cell CL2 of the same type, as shown in FIG. 13.

Figure 13:
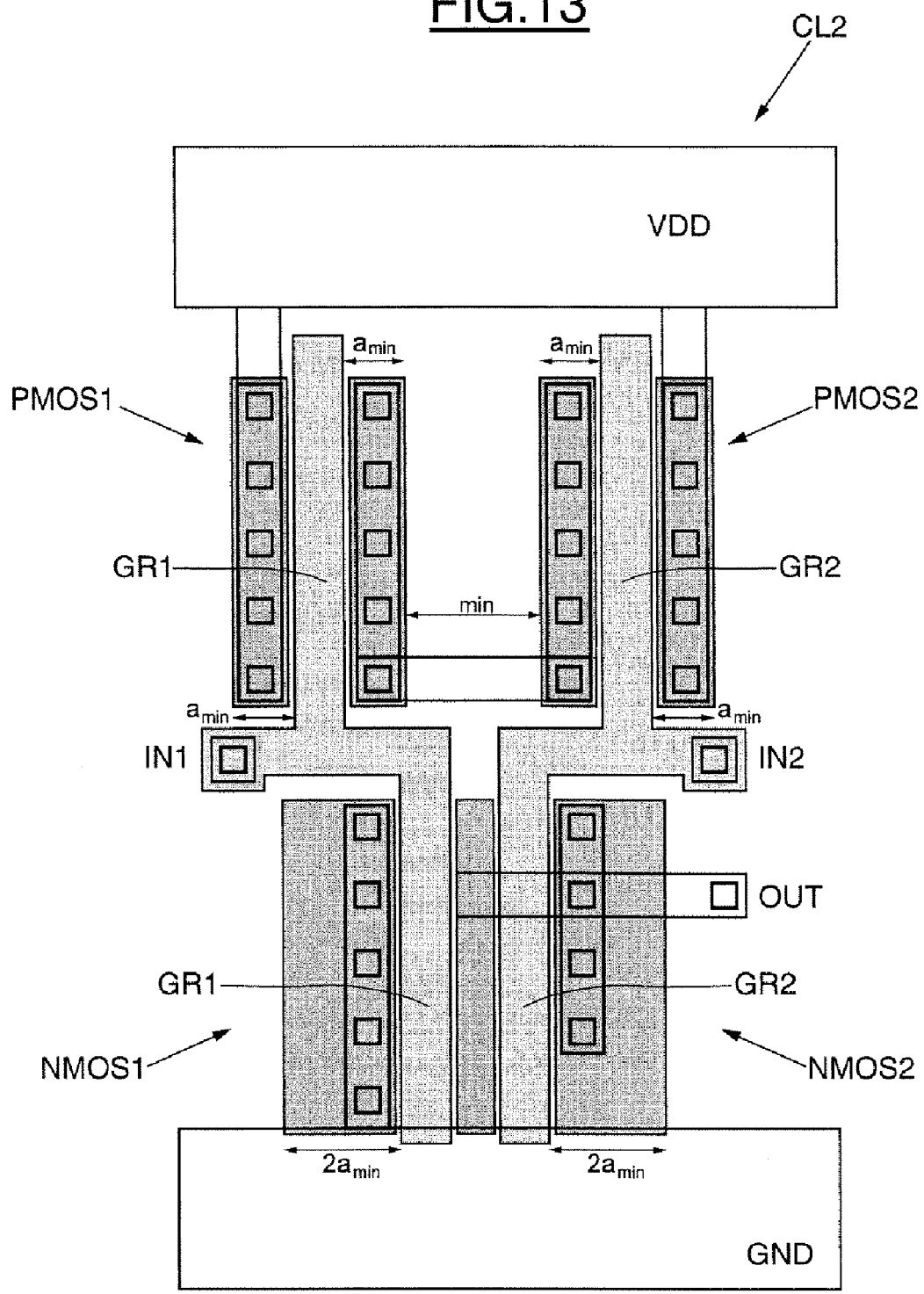

FIG. 13 shows that the source regions of the transistors PMOS1 and PMOS2 are separated by the distance min. Also, the length of these source and drain regions has been made equal to $a_{min}$. Consequently, the stress parameter $a_{eq}$ for these two PMOS transistors is equal to $a_{min}$.

Similarly, the width of the source regions of the NMOS transistors has been increased to $2a_{min}$. Consequently, the stress parameter $a_{eq}$ for the two NMOS transistors is more than twice the required minimum distance $a_{min}$.

The cell CL2, therefore, has a higher mobility than the cell CL1.

Figure 14:
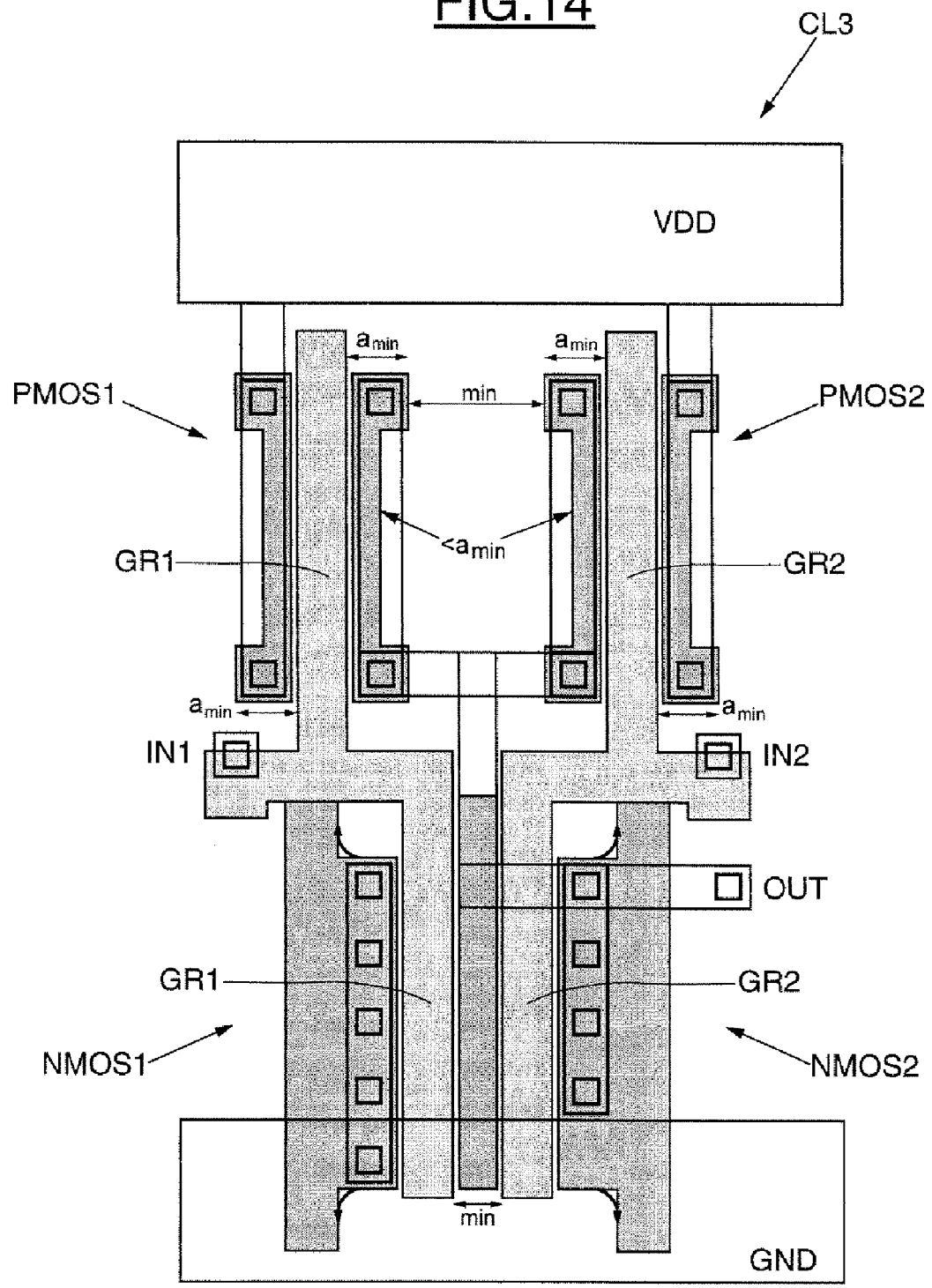

The cell CL3 (FIG. 14), which is also a NAND2 cell, has an even higher mobility. This is because the active areas of the transistors PMOS1 and PMOS2 have a constriction between the contact terminals and the width of this restriction is less than the distance $a_{min}$. Consequently, the stress parameter $a_{eq}$ for the two PMOS transistors is less than the required minimum distance $a_{min}$.

Also, the active areas of the NMOS transistors have obtuse angles, which makes the parameter $a_{eq}$ equal to infinity.

The present invention is not limited to the embodiments and applications described above, and encompasses all variants thereof. For example, the determination of the parameter P has been described above using a reference value $Pa_{min}$ which is the value of the parameter for the reference value $a_{min}$. Without changing the general principles and advantages of the present invention, a different reference value could be used, for example the value of the parameter for a reference distance other than $a_{min}$.

Also, the definition of the electrical parameter P is not limited to the above equation VI. Other equations involving the value of the parameter P for the reference distance and the coefficient depending on the width and the length of the channel could be envisaged for some parameters, such as the threshold voltage.

Thus, to calculate the threshold voltage, an equation of the type $P=Pa_{min}+CP2_{L,W}(1-a_{min}/a_{eq})$ could be used, for example, in which $CP2_{L,W}$ is obtained from the product of two constants $Pa_{min}$ and $CP_{L,W}$.

In this case, the correction of the threshold voltage Vth in the BSIM3v3.2 model, for example, entails correcting only the parameter Vth0 (threshold voltage at zero gate/source voltage and for a large channel width), whereas using a multiplier correction defined by equation VI would necessitate previous correction of the parameters Vth0, K1, K2, K3, K3*b*, Dvt0, Dvt0*w*, Eta0, Etab.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A computer implemented method of compact modeling an integrated circuit including at least one insulated-gate field-effect transistor, said method including:
    defining a stress parameter representing mechanical stresses applied to an active area of the transistor;
    defining a useful active area as some or the whole of the active area; and
    determining, by a processor, at least one electrical parameter of the transistor by using a compact simulation model, the compact simulation model using an equation involving the stress parameter to determine the at least one electrical parameter of the transistor,
    wherein the stress parameter comprises a geometrical parameter of the useful active area of the transistor.

2. The method according to claim 1, wherein the compact simulation model is a Berkeley Short-channel IGFET Model (BSIM) model.

3. The method according to claim 1, wherein the equation used by the compact simulation model to determine the at least one electrical parameter of the transistor also involves:
    the at least one electrical parameter determined for a reference distance,
    the reference distance, and
    a coefficient associated with the at least one electrical parameter and depending on a width and a length of a channel of the transistor.

4. The method according to claim 1, wherein defining the stress parameter comprises producing the stress parameter from the layout diagram of the transistor.

5. The method according to claim 1, wherein the at least one electrical parameter includes at least one of low-field carrier mobility, a threshold voltage, and a drain source resistance.

6. The method according to claim 1, further including outputting the at least one electrical parameter of the transistor to a tangible computer readable medium or display.

7. A computer implemented method of compact modeling an integrated circuit including at least one insulated-gate field-effect transistor, said method including:
    defining a stress parameter representing mechanical stresses applied to an active area of the transistor;
    defining a useful active area as some or the whole of the active area; and
    determining, by a processor, at least one electrical parameter of the transistor by using a compact simulation model, the stress parameter being taken into account in the compact simulation model, wherein the stress parameter comprises a geometrical parameter representing a distance in a direction of a length of a channel of the transistor between a gate of the transistor and an edge of the useful active area.

8. The method according to claim 7,
wherein the useful active area of the transistor is rectangular and the gate is centered in the useful active area to define geometrically identical source and drain regions, and
the stress parameter is defined as the distance in the direction of the length of the channel between a flank of the gate and the corresponding edge of the source or drain region.

9. The method according to claim 7,
wherein the useful active area of the transistor includes geometrically different source and drain regions,
the method further includes defining a first geometrical parameter representing a first distance in the direction of the length of the channel between the gate and the edge of the source region and a second geometrical parameter representing a distance in the direction of the length of the channel between the gate and the edge of the drain region, and
the stress parameter is defined by an equation linking the first geometrical parameter and the second geometrical parameter.

10. A computer implemented method of compact modeling an integrated circuit including at least one insulated-gate field-effect transistor, said method including:
defining a stress parameter representing mechanical stresses applied to an active area of the transistor; and
determining, by a processor, at least one electrical parameter of the transistor by using a compact simulation model, the compact simulation model using an equation involving the stress parameter to determine the at least one electrical parameter of the transistor,
wherein the stress parameter is based on an equivalent geometric parameter of an active area of the transistor, the equivalent geometric parameter being derived from at least one geometric parameter of the active area of the transistor, and
wherein determining the at least one electrical parameter of the transistor is performed from an equation involving the inverse of a value of the stress parameter of the transistor.

11. A system for compact modeling an integrated circuit including at least one insulated-gate field-effect transistor, said system comprising:
generator means configured to define a stress parameter representing mechanical stresses applied to an active area of the transistor; and
generator means configured to define a useful active area as some or the whole of the active area;
processing means including a processor, the processing means being configured to determine, at least one electrical parameter of the transistor by using a compact simulation model, the compact simulation model using an equation involving the stress parameter to determine the at least one electrical parameter of the transistor,
wherein the stress parameter comprises a geometrical parameter of the useful active area of the transistor.

12. The system according to claim 11, further comprising output means for outputting the at least one electrical parameter of the transistor to a tangible computer readable medium or display.

13. The system according to claim 11, wherein the compact simulation model is a Berkeley Short-channel IGFET Model (BSIM) model.

14. The system according to claim 11,
wherein the generator means is configured to define a useful active area as some or the whole of the active area,
the useful active area of the transistor is rectangular and the gate is centered in the useful active area to define geometrically identical source and drain regions, and
the generator means is configured to define the stress parameter as the distance in the direction of the length of the channel between a flank of the gate and the corresponding edge of the source or drain region.

15. The system according to claim 11,
wherein the generator means is configured to define a useful active area as some or the whole of the active area, the useful active area of the transistor includes geometrically different source and drain regions,
the generator means is configured to define a first geometrical parameter representing a first distance in the direction of the length of the channel between the gate and the edge of the source region and a second geometrical parameter representing a distance in the direction of the length of the channel between the gate and the edge of the drain region, and
the generator means is configured to define the stress parameter from an equation linking the first geometrical parameter and the second geometrical parameter.

16. The system according to claim 11, wherein the equation used by the compact simulation model to determine the at least one electrical parameter of the transistor also involves:
the at least one electrical parameter determined for a reference distance,
the reference distance, and
a coefficient associated with the at least one electrical parameter and depending on a width and a length of a channel of the transistor.

17. The system according to claim 11, wherein the generator means is configured to produce the stress parameter from the layout diagram of the transistor.

18. The system according to claim 11, wherein the at least one electrical parameter includes at least one of low-field carrier mobility, a threshold voltage, and a drain source resistance.

19. A system for compact modeling an integrated circuit including at least one insulated-gate field-effect transistor, said system comprising:
generator means configured to define a stress parameter representing mechanical stresses applied to an active area of the transistor; and
the transistor;
generator means configured to define a useful active area as some or the whole of the active area; and
processing means including a processor, the processing means being configured to determine at least one electrical parameter of the transistor by using a compact simulation model, the stress parameter being taken into account in the compact simulation model,
wherein the stress parameter comprises a geometrical parameter representing a distance in a direction of a length of a channel of the transistor between a gate of the transistor and an edge of the useful active area.

20. A system for compact modeling an integrated circuit including at least one insulated-gate field-effect transistor, said system comprising:

generator means configured to define a stress parameter representing mechanical stresses applied to an active area of the transistor; and processing means including a processor, the processing means being configured to determine at least one electrical parameter of the transistor by using a compact simulation model, the compact simulation model using an equation involving the stress parameter to determine the at least one electrical parameter of the transistor, wherein the stress parameter is based on an equivalent geometric parameter of an active area of the transistor, the equivalent geometric parameter being derived from at least one geometric parameter of the active area of the transistor, and wherein the processing means is configured to determine the at least one electrical parameter from an equation involving the inverse of a value of the stress parameter of the transistor.

21. A computer implemented method of compact modeling an integrated circuit including at least one insulated-gate field-effect transistor, said method including:

defining a stress parameter representing mechanical stresses applied to an active area of the transistor; and determining, by a processor, at least one electrical parameter of the transistor by using a compact simulation model, the compact simulation model using an equation involving the stress parameter to determine the at least one electrical parameter of the transistor, wherein the stress parameter is based on an equivalent geometric parameter of an active area of the transistor, the equivalent geometric parameter being derived from at least one geometric parameter of the active area of the transistor.

22. A system for compact modeling an integrated circuit including at least one insulated-gate field-effect transistor, said system comprising:

generator means configured to define a stress parameter representing mechanical stresses applied to an active area of the transistor;

processing means including a processor, the processing means being configured to determine, at least one electrical parameter of the transistor by using a compact simulation model, the compact simulation model using an equation involving the stress parameter to determine the at least one electrical parameter of the transistor, wherein the stress parameter is based on an equivalent geometric parameter of an active area of the transistor, the equivalent geometric parameter being derived from at least one geometric parameter of the active area of the transistor.

* * * * *

UNITED STATES PATENT AND TRADEMARK OFFICE
CERTIFICATE OF CORRECTION

| | | |
|---|---|---|
| PATENT NO. | : 7,996,202 B2 | Page 1 of 1 |
| APPLICATION NO. | : 12/264506 | |
| DATED | : August 9, 2011 | |
| INVENTOR(S) | : Raul Andres Bianchi | |

It is certified that error appears in the above-identified patent and that said Letters Patent is hereby corrected as shown below:

Title page, item [57] ABSTRACT, line 3, change "includes generator means" to --includes a generator unit--.

Title page, item [57] ABSTRACT, line 5, change "and processing means" to --and a processing unit--.

Signed and Sealed this
Twenty-seventh Day of September, 2011

David J. Kappos
*Director of the United States Patent and Trademark Office*